United States Patent [19]
Gupta et al.

[11] Patent Number: 5,453,708
[45] Date of Patent: Sep. 26, 1995

[54] CLOCKING SCHEME FOR LATCHING OF A DOMINO OUTPUT

[75] Inventors: Shantanu R. Gupta, Beaverton; Thomas D. Fletcher, Portland, both of Oreg.

[73] Assignee: Intel Corporation, Santa Clara, Calif.

[21] Appl. No.: 368,335

[22] Filed: Jan. 4, 1995

[51] Int. Cl.⁶ .................................................. H03K 19/096
[52] U.S. Cl. ........................... 326/98; 326/94; 327/211
[58] Field of Search ................. 326/94–98; 327/211–212

[56] References Cited

U.S. PATENT DOCUMENTS

| | | | |
|---|---|---|---|
| 4,568,842 | 2/1986 | Koike | 327/211 |
| 4,841,174 | 6/1989 | Chung | 326/94 |
| 4,893,034 | 1/1990 | Tamura | 326/94 |
| 4,929,850 | 5/1990 | Breuninger | 326/94 |
| 5,189,319 | 2/1993 | Fung | 326/98 |
| 5,208,489 | 5/1993 | Houston | 326/98 |

OTHER PUBLICATIONS

"The Metaflow Architecture", IEEE Micro., by Val Popescu, Merle Schultz, John Spracklen, Gary Gibson, Bruce Lightner and David Isaman, 1991.

Primary Examiner—Edward P. Westin
Assistant Examiner—Andrew Sanders
Attorney, Agent, or Firm—Blakely, Sokoloff, Taylor & Zafman

[57] ABSTRACT

A clocking scheme provides for an improved latching of an output from a domino circuit by delaying a precharging of a domino node. The precharging delay is achieved by introducing the delay in the clocking circuitry which activates the precharging of the domino node. No delay is introduced in the data path in order not to delay the evaluation and transmission of the data signal. During one phase of a clocking cycle, the domino node is precharged to a predetermined logic state. Also during this precharge phase, an input latch couples an input data signal to the domino circuit. During the other phase of the clocking cycle, the domino circuit performs a logic operation based on the input signal. Also during this evaluation phase, an output latch latches the logic state of the domino output for transmission from the output latch. Subsequently, when the precharging phase commences, the precharging of the domino node is delayed until the output latch is completely deactivated, thereby ensuring that the precharge is not latched out to corrupt the data being transmitted.

13 Claims, 8 Drawing Sheets

CLOCKING SCHEME FOR LATCHING OF A DOMINO OUTPUT

BACKGROUND OF THE INVENTION

1. Field of the Invention

The present invention relates to the field of semiconductor devices, and more particularly to transfer of data from domino circuits.

2. Prior Art

A variety of latching circuits are known for transferring of data. Generally, these latching circuits receive a data input and generate an output under control of a clocking signal. One class of latching circuits is comprised of an input latch, an output latch and some form of circuitry disposed between the two latches for operating on the input data before it is sent as an output from the output latch. In faster circuits, the data transition from input to output is achieved within a single clock cycle.

One form of the above circuitry, in which the circuitry between the latches provides logic operations based on an input signal are known as domino circuits. Domino circuits are generally used to evaluate a logic operation based on a given input. The logic operation can be performed within one or more logic stages. Where multiple stages are present, an evaluation of one stage is rippled to a subsequent stage until a final evaluation is made in the final stage. Thus, the effect is for the logic to ripple ("domino") through the various stages, wherein each subsequent stage performs its evaluation based on the previous evaluation. After the completion of the evaluation in the final stage, an output is provided from the domino circuit through the output latch.

In order to transition data rapidly from input to output, it is preferred to remove any delaying elements (or at least not introduce any additional delaying elements) in the data path. However, when delay is removed to speed the data transfer, unwanted conditions, such as racing conditions, start to occur. In a racing condition, a value of a data on a data line can be corrupted due to a presence of an unwanted signal on the data line. In such instances, a desire for speed has corrupted valid data, or has the potential of corrupting data. Although it may appear trivial, such conditions can present insurmountable obstacles in enhancing the data transfer rate. In the design of microprocessors, any speed gained without the potential for corrupting data is a significant improvement.

The present invention resides within this category of improvements, where data transfer speed is enhanced without compromising the validity of that data.

SUMMARY OF THE INVENTION

The present invention provides for an improved latching of an output from a domino circuit by delaying a precharging of a domino node and wherein the delay is achieved in a clocking scheme without introducing the delay in the signal transmission path. In a domino configuration, a domino logic stage is precharged to a predetermined state prior to a first phase of a clocking cycle and an input data signal is made available to the domino stage. During the first phase of the clocking cycle, the input signal is evaluated by the logic of the domino stage(s). Also during this evaluate phase, an output latch latches the domino output from the last domino stage as data output from the domino circuit. Subsequently, during a second phase of the clocking cycle, the domino node is precharged while an input latch couples in the next data signal to the stage for evaluation in the subsequent clocking cycle. However, precharging of the domino node during this precharge phase is delayed until the output latch is deactivated, thereby ensuring that the precharge is not latched out to corrupt the data being transmitted.

Although a number of delaying schemes are available, the present invention utilizes gate delays by having the precharge activation signal transition through a plurality of gates so that these inherent gate delays delay the activation of the precharging of the domino node until the output latch is turned off. The delay is imposed in the clocking signal and not in the data path.

Examples are shown to illustrate the application of domino circuits of the present invention. In one scheme, the precharging of a single stage circuit is shown in which the precharge phase is delayed until the output latch is completely shut off. In another scheme, two sequential domino stages are shown. The examples illustrate the clocking scheme of the present invention, in which precharging of the last domino stage is delayed until the output latch is completely shut off. However, since the delay is controlled by the clocking signals, the precharge delay is not introduced in the actual data path.

Economic Advantage

By providing for a domino circuit which permits rapid data evaluation and transfer with minimal delay but without sacrificing the requirements of controlling race conditions which corrupt data, faster circuitry, as well as faster microprocessors, can be designed. Faster devices permit more information to be processed per unit time thereby having an economic advantage.

DETAILED DESCRIPTION OF THE PREFERRED EMBODIMENTS

A clocking scheme for improved latching of an output from a domino circuit is described. In the following description, numerous specific details are set forth, such as specific devices, signals, timing sequences, etc., in order to provide a thorough understanding of the present invention. However, it will be obvious to one skilled in the art that the present invention may be practiced without these specific details. In other instances, well known structures for operation and use of domino circuits have not been described in detail in order not to unnecessarily obscure the present invention.

Figure 1:
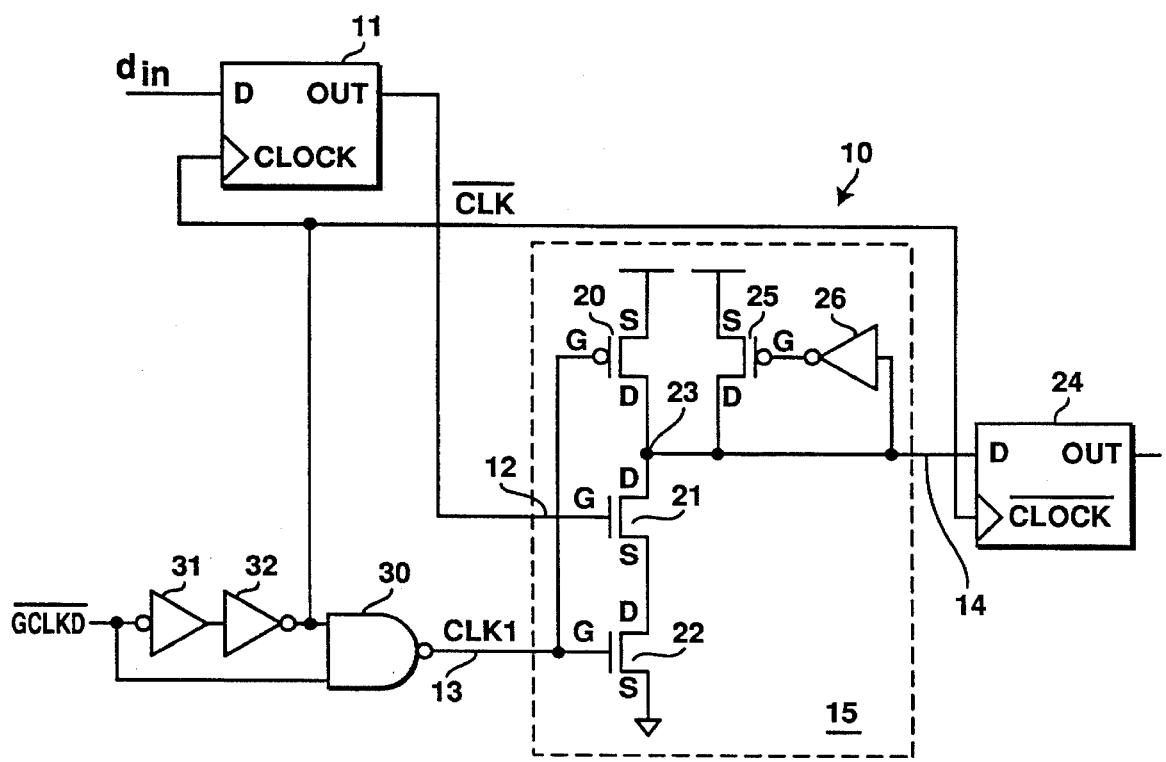
FIG. 1 is a schematic diagram of a domino circuit having no delay in the data path, but in which a racing condition can occur if a domino node starts to precharge while data is still being transferred from an output latch.

Referring to FIG. 1, a circuit 10 for latching a domino output is illustrated. The use and operation of circuits for providing a domino output are generally known and circuit 10 is one preferred implementation for providing such output. Domino circuits are generally used to "domino" a certain logic state from one stage to another. Generally, a domino node for each stage is precharged to a preset level (such as logic "1") and then the node responds to one or more input signals. The node will respond to the input signal(s) according to the logic configuration for the stage. The node response is then latched out and/or coupled to a next stage, wherein the domino output from the first stage now becomes an input or one of multiple inputs to the subsequent stage. The transition effect of the logic states through the sequence of stages is analogous to having a ripple (or "domino") effect. Circuit 10 is just one representation of such domino circuits.

In circuit 10 of FIG. 1, the portion of the circuitry pertaining to its domino stage 15 is shown enclosed within a dotted-line. Input to the domino stage 15 is shown as input 12, while output 14 represents the output from stage 15. The other input signal to stage 15 is a clocking signal 13. The particular circuit of stage 15 shown represents the simplest of domino stages for illustrative purpose. As noted in the figure, stage 15 has only one input data signal.

As shown in FIG. 1, domino stage 15 is comprised of three transistors 20–22, coupled in series between a supply source (VCC) and its return, which in this instance is ground. The two transistors 21–22 closest to ground are n-channel transistors, while transistor 20, which is coupled to VCC, is a p-channel transistor. The input 12 is coupled to the gate of transistor 21, while the gates of transistor 20 and transistor 22 are coupled together to receive the clocking signal 13.

An output from this series configuration of transistors 20–22 is obtained at node 23, which is at the junction of the drains of transistors 20 and 21. Node 23 (which is referred to as the "domino node") is coupled as output 14. Also within stage 15 is a second p-channel transistor 25, which is coupled between node 23 and VCC. Its gate is coupled to node 23 through inverter 26. The purpose of transistor 25 is to operate as a "pull-up" device to keep node 23 at VCC potential whenever node 23 has gone high (a higher voltage state, which is also a logic "1" state). The operation of transistor 25 is not critical to the understanding of the clocking scheme of the present invention.

The gates of transistors 20 and 22 are coupled together, since it is desirable to control the activation of these transistors by the clocking signal 13, which is also denoted as signal "CLK1 ." In operation, transistor 20 conducts when CLK1 is low (a lower voltage state, which is also a logic "0" state) and transistor 22 conducts when CLK 1 is high. Thus, one or the other transistor 20 or 22 will be conducting, depending on the state of the CLK 1 signal. The activation of transistor 21 is controlled by the data input 12, but this input 12 is usable only when transistor 22 is on. If the data input 12 is high, transistor 21 conducts and when data 12 is low, transistor 21 is shut off.

The CLK 1 signal controls the operation of the domino stage 15 depending on which portion of the cycle it is in. Prior to a first phase (which is the second phase of the previous clock cycle), when CLK 1 is low, transistor 20 conducts to precharge node 23 to a logic "1" state. The purpose of the precharge is to establish node 23 to a preset state (also referred to as a "precharge" state). Also prior to the first phase, a valid input signal 12 is made available at the gate of transistor 21. Then, during the first phase (also referred to as an "evaluate" phase) when CLK1 is high, transistor 22 conducts and transistor 20 shuts off. The input signal 12 will determine if transistor 21 is to conduct. If data input is a logic "1", transistor 21 conducts, placing a logic "0" at node 23. However, if the data input is a logic "0", node 23 remains in its precharged logic "1" state. Thus, the domino stage 15 performs an evaluation based on the input 12 and the logic provided by transistors 20–22.

Also during the evaluate phase, the logic state of node 23 is coupled as output 14. This output 14 can then be latched out or coupled as an input to a subsequent domino stage. If there is another logic stage to perform an evaluation, the evaluation occurs also during this same evaluate portion of the clock cycle. Thus the logic evaluation ripples through however many stages are sequentially arranged from stage 15. In order to illustrate other types of domino logic, FIGS. 2, 3 and 4 have been provided.

Figure 2:
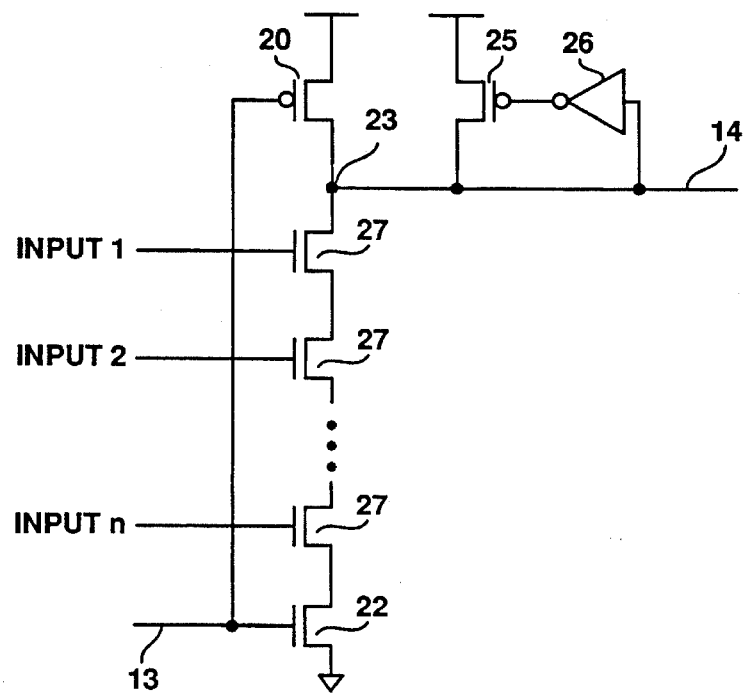
FIG. 2 is a schematic diagram to illustrate a domino stage in which transistors are configured serially to evaluate a number of data inputs.
Figure 3:
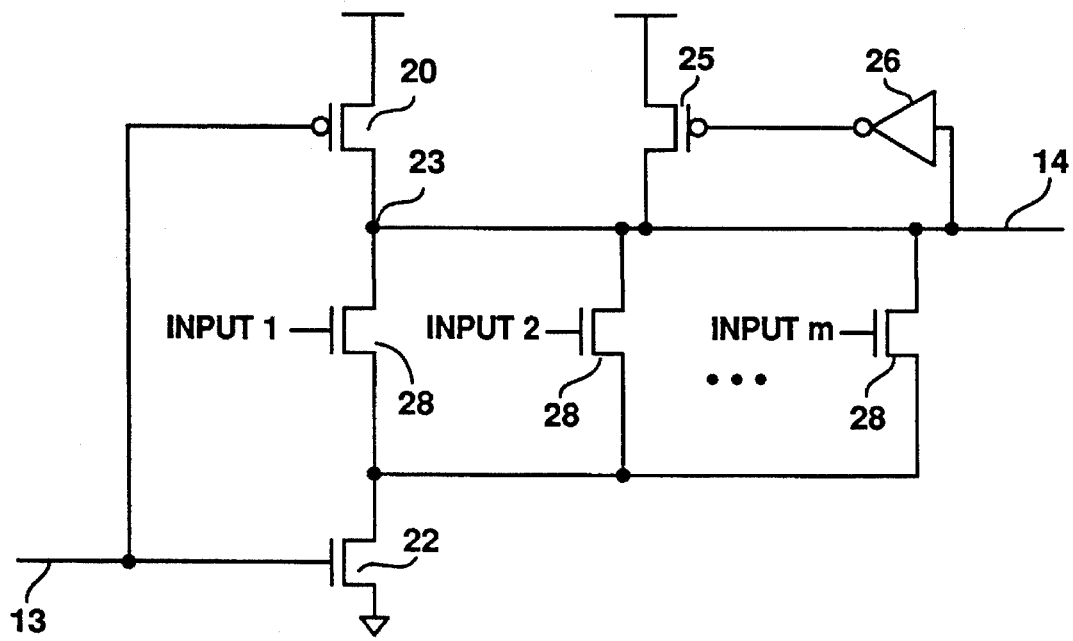
FIG. 3 is a schematic diagram to illustrate a domino stage in which transistors are configured in parallel to evaluate a number of data inputs.
Figure 4:
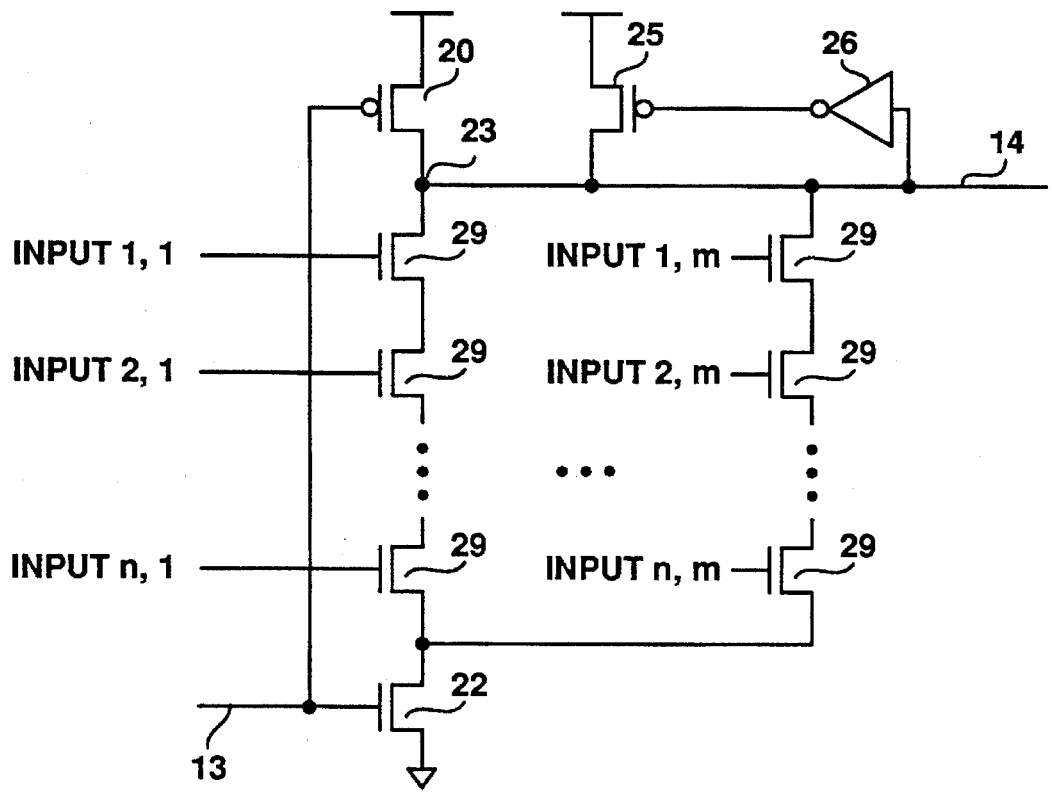
FIG. 4 is a schematic diagram to illustrate a domino stage in which transistors are configured both serially and in parallel to evaluate a number of data inputs.

Referring to FIGS. 2–4, other illustrative examples for domino logic are provided. It is to be appreciated that these illustrations are provided for exemplary purpose and are not intended to limit the types of circuitry which can be used for stage 15 or any other domino stage. In FIG. 2, a series configuration is shown in which serial arrangement of transistors are disposed between the domino node and the n-channel clocking transistor 22. Transistors 27 provide for multiple inputs and in which all of the inputs must be high for the domino node 23 to be pulled low. Essentially, input transistor 21 of FIG. 1 is replaced by a plurality of input transistors 27.

In FIG. 3, a parallel configuration is shown in which a number of input transistors 28 are coupled in parallel between the domino node 23 and the n-channel clocking transistor 22. Essentially, transistor 21 of FIG. 1 is replaced by a plurality of parallel input transistors 28. In this arrangement, conduction of any one of the input transistors 28 will pull the domino node low.

FIG. 4 shows an arrangement in which both serial and parallel arrangements are used. It is essentially a matrix having "n" row and "m" column arrangement of input transistors 29. Thus, it is to be noted that the arrangements are endless and the particular arrangement selected will depend on the desired logic operation that is to be performed by a domino stage 15. Although the numbers are many, the various designs available are not critical to the understanding of the present invention, but are being presented in order to show the context in which the present invention is utilized.

Referring again to FIG. 1, circuit 10 shows additional circuit components which are associated with the circuitry of stage 15. An input latch 11 is shown coupling data ($d_{in}$) as data input to stage 15. Latch 11 latches in the data when a clocking signal CLK# goes high (the # symbol is equivalent to the "bar" above the signal name, as shown in the drawings). An output latch 24 is shown latching the domino output from node 23. If stage 15 is coupled to other domino type stages, the last stage will usually be coupled to latch 24. Output latch 24 latches out the data when the CLK# signal goes low.

As is also noted in circuit 10, logic is provided to generate the necessary timing (or clocking) signals required. A GCLKD# signal is shown representing a clocking signal, which timing is controlled by a master or system clock. GCLKD# signal is then used to generate clocking signals for controlling the precharge and evaluate phases of circuit 10. As noted, two inverters 31–32 and NAND gate 30 are used to provide the necessary timing. The GCLKD# signal is coupled to one input of NAND gate 30. The GCLKD# signal is also coupled through two inverters 31 and 32 to provide the CLK# clocking signal, which is coupled to a second input of NAND gate 30. The CLK# signal is coupled as well to the two latches 11 and 24 to provide the clocking of those latches. The purpose of inverters 31 and 32 is to buffer the GCLKD# signal for "fan-out" and to slightly delay the CLK# signal. The CLK# signal to the latches 11 and 24 operate to activate inverters from a tri-state position within those latches to allow data signals to be latched through the latches.

Figure 5:
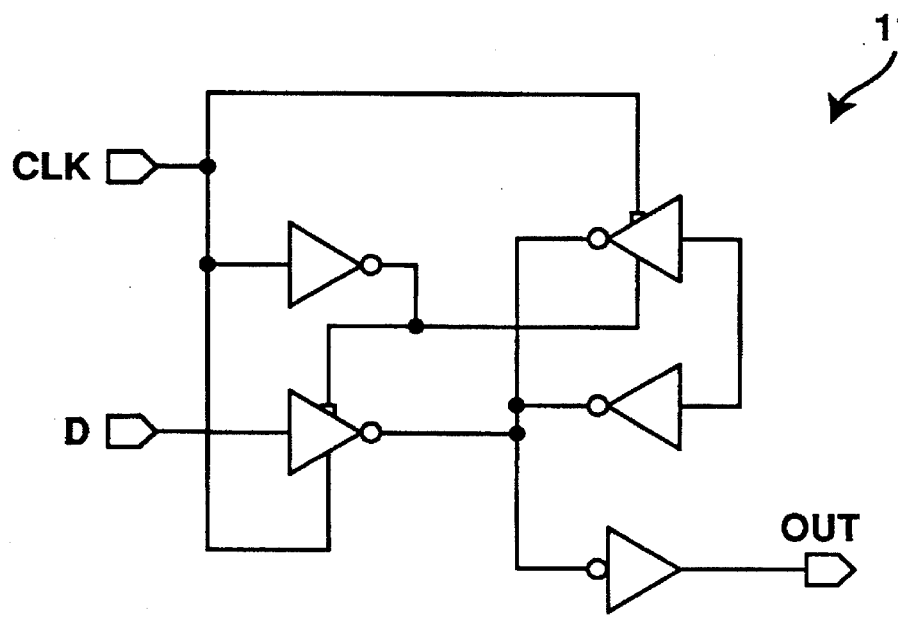
FIG. 5 is a schematic diagram of a latch circuit which is used as an input latch for the circuit shown in FIG. 1.
Figure 6:
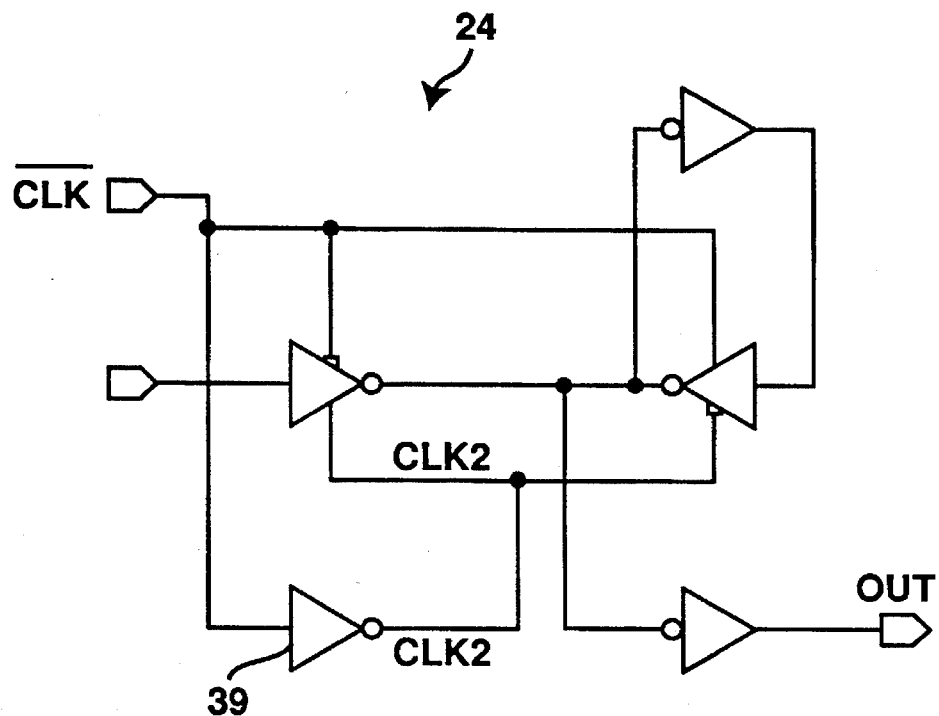
FIG. 6 is a schematic diagram of a latch circuit which is used as an output latch for the circuit shown in FIG. 1.

The circuitry for the two latches are shown in FIGS. 5 and 6, but are being provided for exemplary purpose only, since the actual circuit of these latches 11 and 24 are not significant to the operation of the present invention, except for the clocking scheme described below. It should be noted that the CLK# signal is coupled to both of the latches 11 and 24, but that it requires a high state to latch data through latch 11 and a low state to latch data through latch 24. Therefore, the CLK# signal causes data $d_{in}$ to be latched in during one half-cycle of the CLK# signal and the domino output to be latched out during the other half-cycle of the CLK# signal. As noted in FIG. 6, the inverted CLK# signal is denoted as CLK2.

Figure 7:
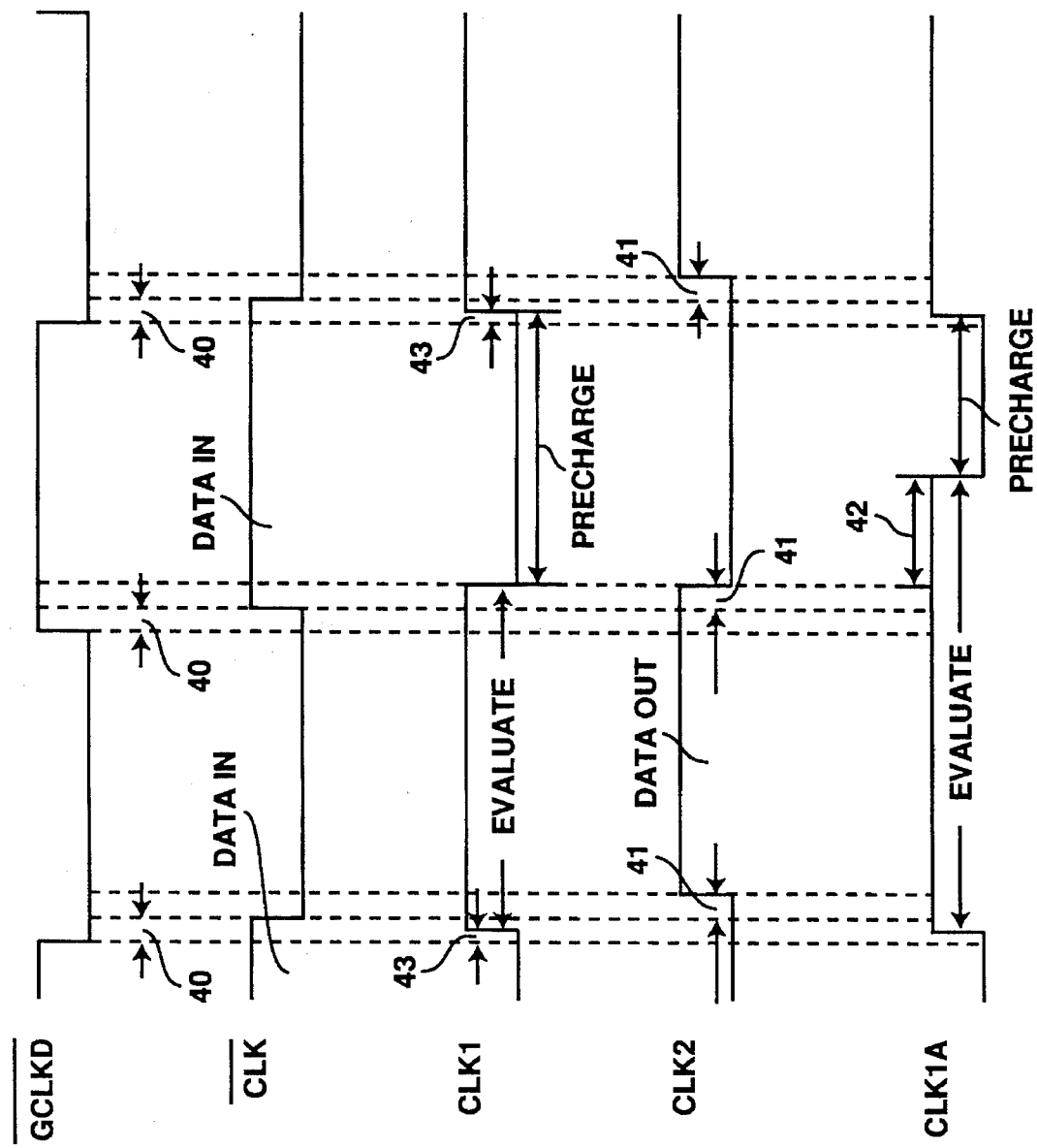
FIG. 7 is a timing diagram showing a number of clocking signals associated with the circuit of FIG. 1 and also showing a timing signal of the present invention for delaying the activation of the domino node.

Also referring to FIG. 7, the various clocking signals are illustrated. The CLK# signal is essentially the GCLKD# signal, but with a slight built in delay 40 due to the gate delays of inverters 31 and 32. The CLK 1 signal is provided by a logical NAND operation of GCLKD# and CLK# and is high whenever either GCLKD# or CLK# is low. There is a slight delay 43 due to the presence of NAND gate 30. Accordingly, the precharge phase occurs when CLK 1 is low. There may be a slight delay from the falling edge of CLK 1 until the start of the precharge phase. However, for all purposes, the precharge phase commences when CLK1 goes low. The precharge phase is denoted as the second phase of the clock cycle in the description, but the nomenclature (as to first phase or second phase) is strictly arbitrary. What is important is that there be one phase for evaluating the logic of the domino stage(s) and providing the output. During the other phase, the domino stage is reset by having the domino node 23 precharged and the next input signal made available to the input of the domino stage. Thus, *when CLK1 transitions high again, the next evaluate phase commences.

The input signal $d_{in}$ drives the input transistor 21. If transistor 21 is turned on due to logic "1" at the input 12, then node 23 transitions from its precharged "1" state to a "0" state during the evaluate phase. If transistor 21 is not on due to logic "0" at input 12, then node 23 remains at the precharged "1" state. Since CLK2 is essentially the inverse of the CLK# signal, but with a slight gate delay 41, it is high at this time to latch the logic state of node 23 out through latch 24.

Now when CLK# transitions from low to high to latch in the next input data, both CLK1 and CLK2 will transition from high to low. The conduction of transistor 20 starts the precharging of node 23. Thus, node 23 begins to precharge while output latch 24 turns off. In order not to couple the precharge state of node 23 as an output from latch 24, it is imperative to turn off latch 24 prior to the commencement of the precharge sequence. Otherwise, a race condition may result in which the precharge state may be passed through to the output of latch 24, thereby resulting in the corruption of data. Ideally, a gate delay inherent in the precharge transistor 20 should provide for some inherent delay from the falling edge of CLK 1 until the start of the precharge sequence. However, this delay may not be adequate to prevent a race condition from occurring.

However, in practice, it is not reliable from a design perspective to rely strictly on this delay to ensure that a race condition will not develop. Furthermore, as semiconductor technology advances resulting in shorter and shorter gate delays, this "turn-on" delay may be so short that it becomes difficult to completely turn off the output latch 24 prior to the start of the precharge sequence. Thus, with this problem noted, it is an object of the present invention to increase the timing separation between turning off the output latch 24 and activating the precharge sequence of node 23. It is also an object of the present invention to provide this delay, while not sacrificing propagation delay from node 23 to latch 24.

Figure 8:
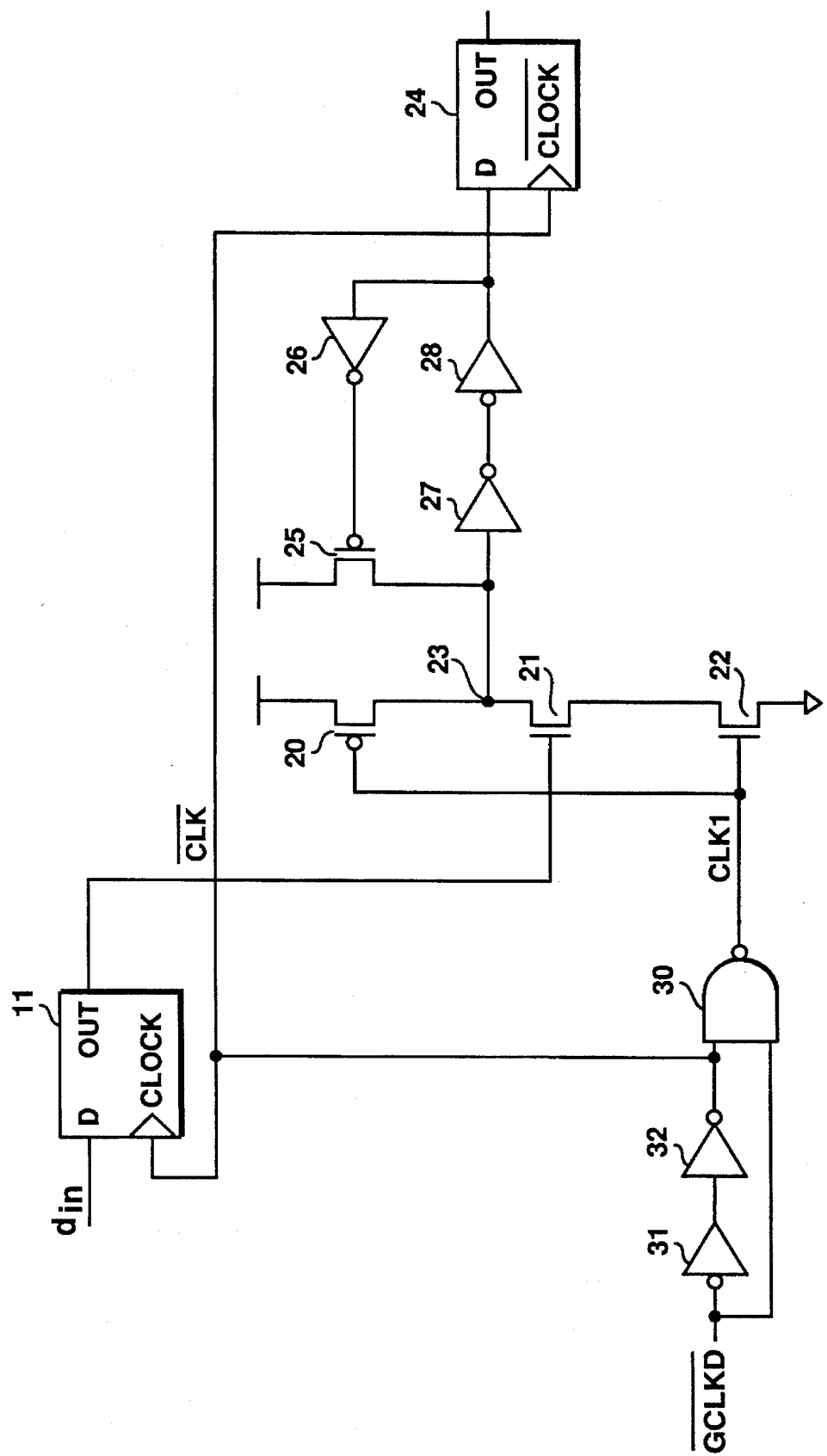
FIG. 8 is a schematic diagram of the domino circuit of FIG. 1 but with an inclusion of two inverters in the data path for providing delay needed to prevent the precharge from being coupled as an output.

One approach to increasing the delay between the turn-off of latch 24 and start of the precharge is to provide a delay between the critical node 23 and output latch 24. One solution is shown in FIG. 8. Referring to FIG. 8, the same circuit as FIG. 1 is shown, except now there are two additional inverters 27 and 28 placed in the path between node 23 and latch 24. The inverters add two additional gate delays in this critical path for the state of node 23 to transition through prior to the input of latch 24. Although the timing of the CLK1 and CLK2 signals have not changed, the inverters 27 and 28 add two additional gate delays between node 23 and the input of latch 24. The two additional gate delays, on top of the transistor 20 gate delay will ensure that the latch 24 is shut off before the precharge value can transition to the latch 24.

Figure 9:
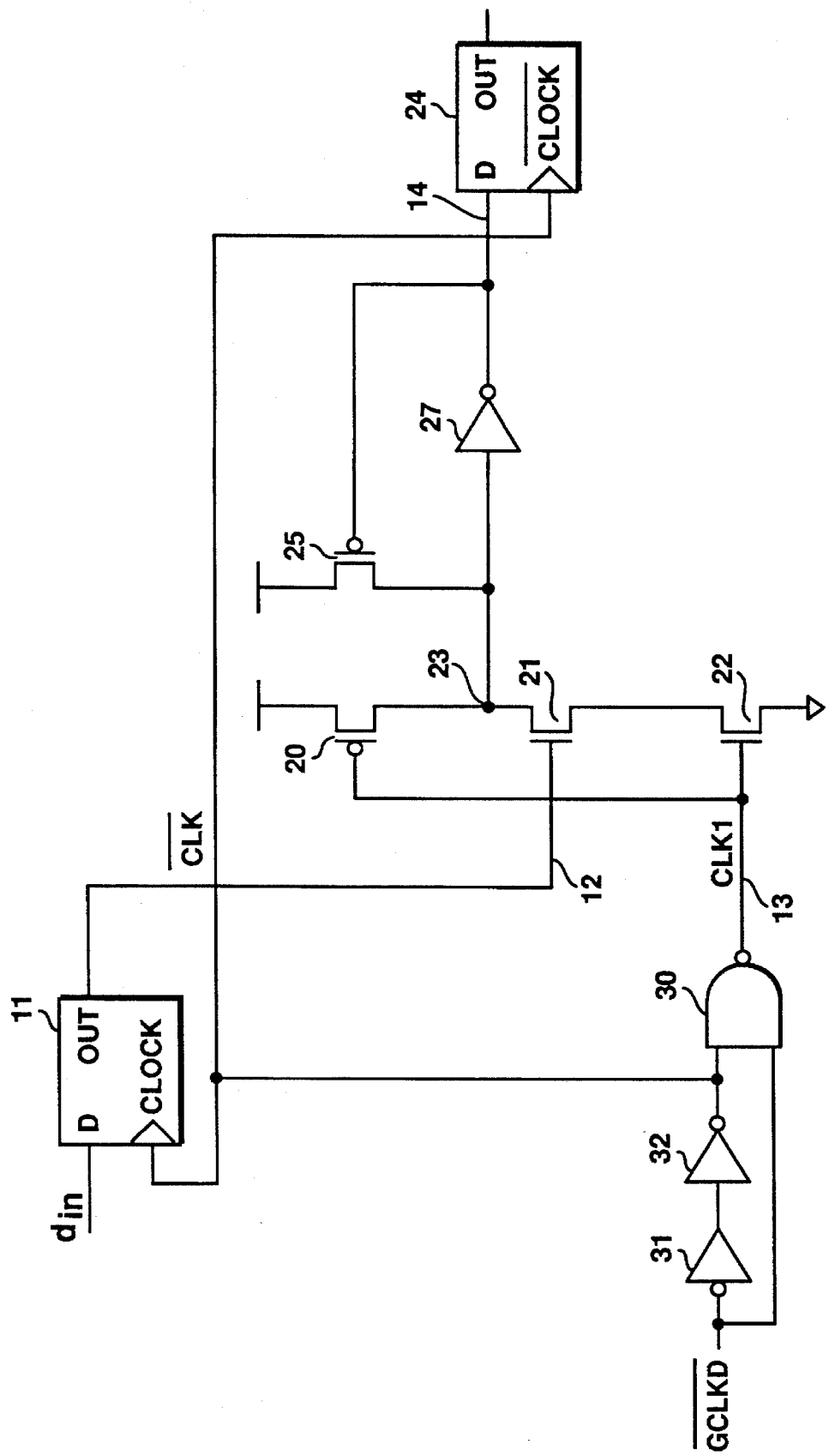
FIG. 9 is a schematic diagram of the domino circuit of FIG. 1 but with an inclusion of a single inverter in the data path for providing delay needed to prevent the precharge from being coupled as an output.

FIG. 9 shows an alternative solution in the event a single gate delay may be sufficient to delay the transfer of the precharge state of node 23 to latch 24. In this instance, applying the same circuit of FIG. 1, only one inverter 27 is used.

The techniques of FIGS. 8 and 9 may resolve the precharge delay problem, but add in another problem. That is, the delays are in the actual data signal path and will introduce delays for the data to transition from node 23 to the output latch 24. It is desirable and in the instance of designing microprocessor circuitry, sometimes fatal to introduce undesirable delays in the data path.

Figure 10:
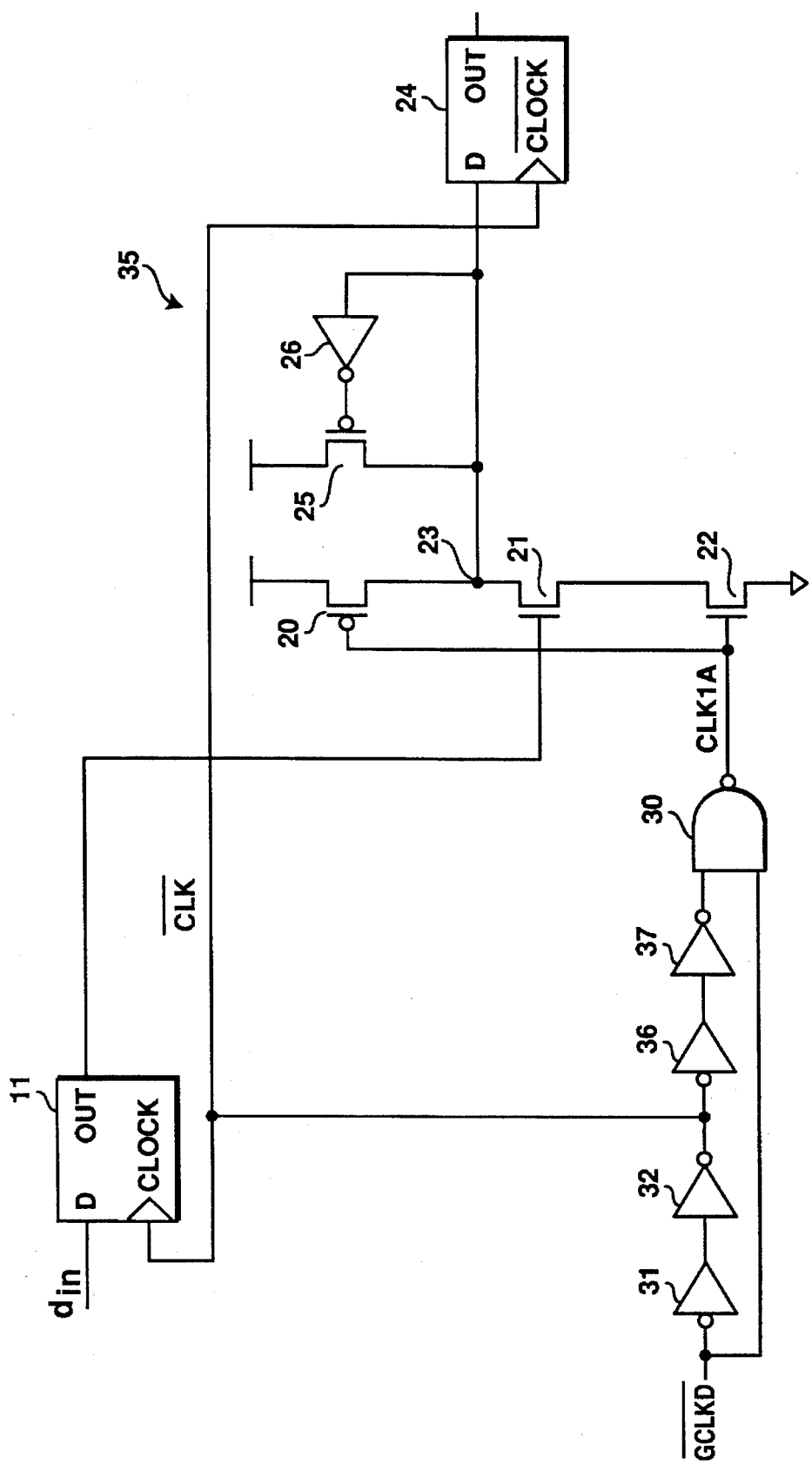
FIG. 10 is a schematic diagram of a circuit of the present invention showing only a single domino stage, in which the precharge is delayed by the clocking scheme to ensure that the data output is no corrupted by the precharge, but where there is no delay in the data path.

Referring to FIG. 10, a circuit 35 of the preferred embodiment is shown. Circuit 35 is the same as circuit 10 of FIG. 1 but with the exceptions noted below. Although not shown, it is understood that a variety of domino circuits can be readily implemented for domino stage 15, as was described in reference to FIG. 1. Inverters 36 and 37 are now included to provide the necessary precharge transition delay, but without delaying the data transition. Inverters 36 and 37 introduce the delay at the front end of the precharge sequence and the circuit need not rely on the transition time between node 23 and output latch 24. Essentially, the delay is introduced through the clocking scheme in which the start of the precharge phase is delayed. However, the evaluate phase is not delayed.

Inverters 36 and 37 are inserted between the output of inverter 32 and input of NAND gate 30. Since no delay is introduced in the path for the CLK# signal, the activations of latches 11 and 24 are not delayed. Furthermore, since the delay is not in the data path, data transfer during the evaluate phase is not delayed. Also, since the NAND gate 30 still has one input coupled directly to GCLKD#, the data transfer period still commences at the falling edge of the GCLKD# signal. However, as noted by the timing diagram of FIG. 7, the clocking signal at the output of the NAND gate 30 is now shown as clocking signal CLK1A. The falling edge is delayed by an additional delay 42 that corresponds to the delay introduced by inverters 36 and 37. The inverters essentially lengthens the high state of CLK 1A over the earlier signal CLK1. The precharge phase is shortened but the period is still sufficient to fully precharge node 23. Thus, significant time elapses from the time output latch 24 turns off until node 23 begins to precharge, preventing any possibility for the precharge to feed through to the output of latch 24.

Figure 11:
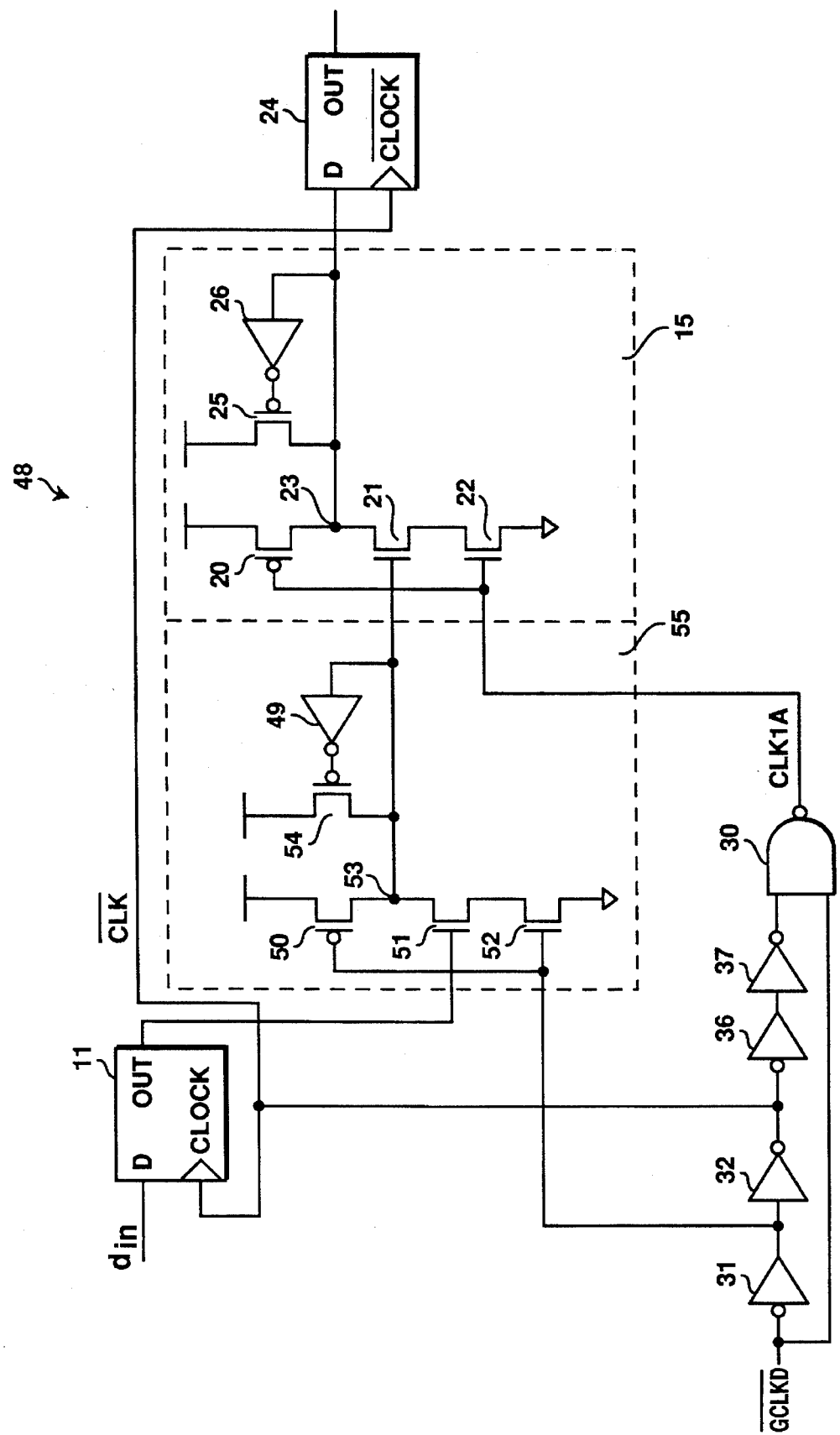
FIG. 11 is a schematic diagram of an example of a two stage domino circuit utilizing the precharge delaying scheme of the present invention.

Referring to FIG. 11, another domino circuit 48 utilizing the present invention is shown. Circuit 48 is one example of circuitry utilizing two domino stages. The domino stage 15 from FIG. 1 forms the second stage, while a separate domino arrangement forms the earlier stage denoted as stage 55. In this configuration, transistors 50–52 function equivalently to transistors 20–22, respectively. Transistor 54 and inverter 49 function as a "pull-up" similar to transistor 25 and inverter 26. The input signal from input latch 11 is now coupled to the gate of transistor 51 and the gates of transistors 50 and 52 are coupled to the output of inverter 31 to obtain the clocking signal for stage 54. Domino node 53 of the first stage 55 is coupled as input to the next stage 15. Thus, two stages of domino are noted for evaluation of data $d_{in}$. The precharge of the first stage 54 is not a concern, since the "ripple" effect transitions all the way to the last domino node (which is node 23 in this instance). It is the timing of the precharge of the last stage 15 in relationship to the data transfer in the output latch 24, which is the concern noted earlier. As was described earlier, the built-in precharge delay of node 23 provides for the necessary delay to ensure that the output data will not be corrupted.

Thus, a clocking scheme for improved latching of an output from a domino circuit, while not sacrificing propagation delay is described. It is to be appreciated that the clocking scheme of the present invention can be used in a variety of circuits and devices. The present invention is well suited for implementation in a microprocessor due to the concern for improving data processing and transition times.

We claim:

1. A circuit for providing a latched data output from a logic determining node, which is precharged to a predesignated precharge state prior to providing said latched data output, said circuit comprising:

a logic evaluation circuit having a plurality of inputs coupled to receive a corresponding plurality of input data signals, said circuit providing a logic evaluation output on said logic determining node based on said input data signals;

an output latch coupled to said logic determining node of said logic evaluation circuit for latching said logic evaluation output as said latched data output;

a clocking circuit for generating a clocking signal having an evaluation phase and a precharge phase for each cycle of said clocking signal for enabling said output latch and said logic evaluation circuit;

said clocking circuit coupled to said output latch for latching said logic evaluation output during said evaluation phase;

said clocking circuit also coupled to said logic evaluation circuit for precharging said logic determining node to said precharge state during said precharge phase and activating said logic evaluation circuit during said evaluation phase; and wherein precharging of said logic determining node during said precharge phase is delayed once said clocking signal shifts from said evaluate phase to said precharge phase, such that precharging of said logic determining node is delayed unit said output latch is disabled, but wherein said delay is not present between said logic evaluation node and said output latch to delay transmission of said logic evaluation output from said logic determining node to said output latch; and wherein said precharging delay is achieved by transitioning said clocking signal through a plurality of gates coupled between input of said clocking signal and said logic evaluation circuit.

2. The circuit of claim 1 further including an input latch for receiving and latching in said input data signal to said logic evaluation circuit.

3. The circuit of claim 1 wherein said input data signal is received from another logic evaluation circuit.

4. A circuit for providing a latched data output from a domino node, which is precharged to a predesignated precharge state prior to providing said latched data output, wherein a clocking scheme delays precharging of said domino node in order to prevent said precharging from being coupled as said latched data output from said domino node during precharging of said domino node comprising:

an input data signal;

a domino circuit, coupled to receive said input data signal, for providing a domino output on said domino node based on said input data signal;

said domino circuit comprised of a p-channel transistor coupled between said domino node and a supply voltage, a first n-channel transistor coupled between said domino node and a second n-channel transistor, and said second transistor coupled between said first n-channel transistor and a supply voltage return, such that all three transistors are coupled in series between said supply voltage and its return and wherein said domino node responds to said input data signal by remaining in said precharge state or changing to a lower potential state when both of said n-channel transistors are activated;

gate of said first n-channel transistor coupled to receive said input data signal, wherein a state of said input data signal determines activation of said first n-channel transistor;

gates of said p-channel and second n-channel transistors being coupled together in order to allow only one of said p-channel or said second n-channel transistor to be active at any given time, said p-channel transistor being active during a precharge phase and said second n-channel transistor being active during and evaluation phase;

an output latch coupled to said domino node of said domino circuit for latching said domino output as said latched data output;

a clocking circuit coupled to receive a system clocking signal and generating its clocking signals for timing said evaluation and precharge phases in order to control operation of output latch and said domino circuit;

said clocking circuit including a first inverter and a second inverter coupled in series to receive said system clocking signal and providing as their output a buffered clocking signal;

said clocking circuit having said buffered clocking signal coupled to said output latch for latching out said domino output during said evaluation phase;

said clocking circuit also having a third inverter and a fourth inverter coupled in series to receive said buffered clocking signal and providing as their output a delayed clocking signal;

said delayed clocking signal being coupled to gates of said p-channel and second n-channel transistors of said domino circuit for delaying activation of said p-channel transistor from precharging said domino node, such that precharging of said domino node is delayed until said output latch is disabled first by said buffered clocking signal in order to prevent said precharged state from corrupting said domino output transmitted from said output latch, but wherein said delay is not present between said domino node and said output latch to delay transmission of said domino output from said domino node to said output latch.

5. The circuit of claim 4 wherein said first n-channel transistor is actually comprised of a plurality of transistors and wherein each is coupled to receive its own input data signal.

6. The circuit of claim 5 further including a NAND gate coupled between said fourth inverter and gates of said p-channel and second n-channel transistors for providing a NAND operation output of said system clocking signal and output of said fourth inverter in order to provide said delayed clocking signal to said domino circuit.

7. The circuit of claim 6 wherein said domino circuit receives said input data signal from an input data latch.

8. The circuit of claim 6 wherein said domino circuit receives said input signal from another domino circuit.

9. In a microprocessor, a circuit for providing a latched data output from a domino node, which is precharged to a predesignated precharge state prior to providing said latched data output, wherein a clocking scheme delays precharging of said domino node in order to prevent said precharging from being coupled as said latched data output from said domino node during precharging of said domino node comprising:

an input data signal;

a domino circuit, coupled to receive said input data signal, for providing a domino output on said domino node based on said input data signal;

said domino circuit comprised of a p-channel transistor coupled between said domino node and a supply voltage, a first n-channel transistor coupled between said domino node and a second n-channel transistor, and said second transistor coupled between said first n-channel transistor and a supply voltage return, such that all three transistors are coupled in series between said supply voltage and its return and wherein said domino node responds to said input data signal by remaining in said precharge state or changing to a lower potential state when both of said n-channel transistors are activated;

gate of said first n-channel transistor coupled to receive said input data signal, wherein a state of said input data signal determines activation of said first n-channel transistor;

gates of said p-channel and second n-channel transistors being coupled together in order to allow only one of said p-channel or said second n-channel transistor to be active at any given time, said p-channel transistor being active during a precharge phase and said second n-channel transistor being active during and evaluation phase;

an output latch coupled to said domino node of said domino circuit for latching said domino output as said latched data output;

a clocking circuit coupled to receive a system clocking signal and generating its clocking signals for timing said evaluation and precharge phases in order to control operation of output latch and said domino circuit;

said clocking circuit including a first inverter and a second inverter coupled in series to receive said system clocking signal and providing as their output a buffered clocking signal;

said clocking circuit having said buffered clocking signal coupled to said output latch for latching out said domino output during said evaluation phase;

said clocking circuit also having a third inverter and a fourth inverter coupled in series to receive said buffered clocking signal and providing as their output a delayed clocking signal;

said delayed clocking signal being coupled to gates of said p-channel and second n-channel transistors of said domino circuit for delaying activation of said p-channel transistor from precharging said domino node, such that precharging of said domino node is delayed until said output latch is disabled first by said buffered clocking signal in order to prevent said precharged state from corrupting said domino output transmitted from said output latch, but wherein said delay is not present between said domino node and said output latch to delay transmission of said domino output from said domino node to said output latch.

10. The circuit of claim 9 wherein said first n-channel transistor is actually comprised of a plurality of transistors and wherein each is coupled to receive its own input data signal.

11. The circuit of claim 10 further including a NAND gate coupled between said fourth inverter and gates of said p-channel and second n-channel transistors for providing a NAND operation output of said system clocking signal and output of said fourth inverter in order to provide said delayed clocking signal to said domino circuit.

12. The circuit of claim 11 wherein said domino circuit receives said input data signal from an input data latch.

13. The circuit of claim 11 wherein said domino circuit receives said input signal from another domino circuit.

* * * * *